United States Patent
Loewenhardt et al.

(10) Patent No.: US 6,581,612 B1
(45) Date of Patent: Jun. 24, 2003

(54) CHAMBER CLEANING WITH FLUORIDES OF IODINE

(75) Inventors: Peter Loewenhardt, Pleasanton, CA (US); Shamouil Shamouilian, San Jose, CA (US); Pavel Ionov, Glendale, CA (US); Pamanabhan Krishnaraj, San Francisco, CA (US)

(73) Assignee: Applied Materials Inc., Santa Clara, CA (US)

( * ) Notice: Subject to any disclaimer, the term of this patent is extended or adjusted under 35 U.S.C. 154(b) by 74 days.

(21) Appl. No.: 09/836,944

(22) Filed: Apr. 17, 2001

(51) Int. Cl.$^7$ .................................................. B08B 7/00
(52) U.S. Cl. ...................................... 134/1.1; 134/22.18
(58) Field of Search ........................... 134/1, 1.1, 1.2, 134/1.3, 22.1, 22.18, 26; 438/905

(56) References Cited

U.S. PATENT DOCUMENTS 4,310,380 A * 1/1982 Flamm et al. ......... 204/192.32
6,147,006 A * 11/2000 Mouri et al. ................ 216/104

FOREIGN PATENT DOCUMENTS

JP 09301718 A * 11/1997 ........... C01G/35/00

* cited by examiner

Primary Examiner—Alexander Markoff
(74) Attorney, Agent, or Firm—Dugan & Dugan

(57) ABSTRACT

A method of cleaning a semiconductor processing chamber uses as a cleaning gas precursor an iodine fluoride such as $IF_5$ and $IF_7$. Reactive species are generated from the precursor with help of plasma. These reactive species are further used to clean the processing chamber.

9 Claims, 1 Drawing Sheet

CHAMBER CLEANING WITH FLUORIDES OF IODINE

FIELD OF THE INVENTION

The present invention relates to fabrication of semiconductor devices. More particularly, the present invention relates to chemicals for cleaning a deposition chamber.

BACKGROUND OF THE INVENTION

Fabrication of semiconductor devices (integrated circuits or ICs) conventionally includes processing of substrates (wafers) in a number of chambers. In some of these chambers material is accumulated on chamber walls and the material must be periodically removed to avoid particle formation and to ensure stable chamber operation. The quantity of material deposited on chamber walls is particularly significant for deposition chambers such as chemical vapor deposition or physical vapor deposition chambers. It is preferable to clean such material without opening the chamber, i.e. by etching with a reactive gas to remove all the material in the form of a gas. Most types of material deposited on the walls in these chambers can be volatilized and then removed by exposing the walls to molecular or atomic fluorine.

The most direct source of fluorine atoms or molecules ($F_2$) is $F_2$ gas itself. However $F_2$ is dangerous and difficult to handle. Thus it is preferred, in practice, to use compounds such as $NF_3$ or $SF_6$, or a mixture of $C_xF_y$ (e.g., $CF_4$, $C_3F_8$) and $O_2$. To produce fluorine atoms or molecules, plasma is struck in the processing chamber itself or in a remote plasma source.

There are various disadvantages to using these gases for chamber cleaning purposes. For example, in the case of the $C_xF_y/O_2$ mixture, the cleaning rate is low and the cleaning process produces large quantities of $CO_2$. $CO_2$ is a greenhouse gas that cannot be easily remediated and consequently is an environmentally undesirable by-product.

$NF_3$ is expensive and difficult to obtain.

$SF_6$ tends to cause sulfur contamination and accumulation in pump lines of chambers that it is used to clean.

As noted above, $F_2$ is dangerous and difficult to handle—so much so that it is impractical to use as a chamber cleaning gas.

Accordingly it would be desirable to provide a more suitable substance as a cleaning gas precursor.

SUMMARY OF THE INVENTION

The present inventors have recognized that precursors that include iodine, including $IF_5$ and $IF_7$, are suitable for use in cleaning processing chambers. In accordance with the invention, a method of cleaning a processing chamber includes providing a processing chamber adapted to perform a process by which material accumulates on chamber components. The method further includes generating a reactive species from a precursor gas that includes iodine. Then to clean the chamber components they are exposed to the reactive species.

Although iodine-based precursors such as $IF_5$ and $IF_7$ are not free of disadvantages, they are believed to provide a more desirable balance of advantages and drawbacks than cleaning gas precursors that have conventionally been used. For example, $IF_5$ is inexpensive, easy to obtain, and a good source of F atoms. Although $IF_5$ is toxic, it is a liquid at room temperature and therefore easy to handle and store. However, because $IF_5$ is liquid, the chamber cleaning system must include a suitable mechanism to generate a vapor from the $IF_5$ for use as a cleaning gas.

$IF_7$ is not as commercially available as $IF_5$, but is a gas at room temperature and therefore can be used as a precursor without including a vapor generating mechanism in the cleaning system. $IF_7$ can also easily be liquified to aid in handling and storage prior to use. Furthermore, one mole of $IF_7$ contains seven moles of fluorine atoms. Thus more fluorine is produced from a mole of $IF_7$ than from most other precursors. Though toxic, $IF_7$ is an excellent source of F atoms and may prove to be price-competitive with conventional F precursor gases.

Accordingly, $IF_5$ and $IF_7$, when used as precursors in cleaning semiconductor processing chambers, may provide favorable trade-offs as compared to conventional cleaning gas precursors.

Other objects, features and advantages of the present invention will become more fully apparent from the following detailed description of the preferred embodiments, the appended claims and the accompanying drawing.

DETAILED DESCRIPTION

Figure 1:
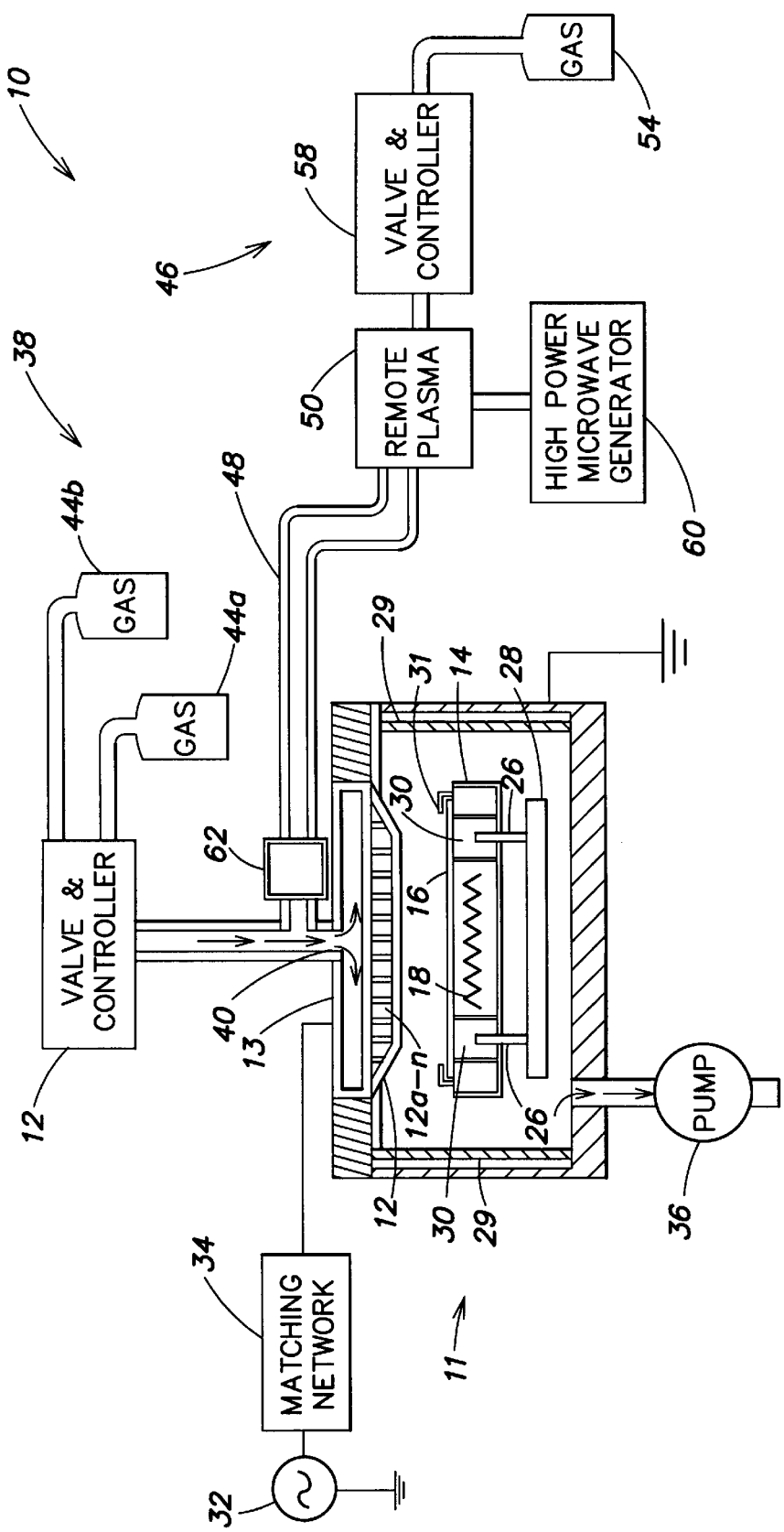
FIG. 1 is a side elevational view of a processing system in which the present invention may be applied.

It is contemplated to use fluorides of iodine in any application for which fluorine atoms or molecules are suitable for use as a reactive species for cleaning a semiconductor processing chamber. Thus, the use of fluorides of iodine may be appropriate in deposition or etching chambers in which any one of the following substances are deposited on chamber surfaces and must be removed: Si, $SiO_2$ silicon nitride (SiN), $SiO_xN_yH_z$ or other dielectrics, organosilicon materials, tungsten, titanium, tantalum, TiN, TaN, etc. The following are examples of types of chambers that may be cleaned using fluorides of iodine: HPDCVD (high density plasma chemical vapor deposition) chambers, PECVD (plasma enhanced chemical vapor deposition) chambers, SACVD (sub-atmospheric chemical vapor deposition) chambers, PVD (physical vapor deposition) chambers, epitaxial deposition chambers, and etching chambers. Particular examples of chambers in which the present invention may be employed include a model AKT-1600 PECVD system manufactured by AKT, Inc. and described in U.S. Pat. No. 5,788,778, which is hereby incorporated by reference herein in its entirety, or the GIGAFILL™ processing system manufactured by Applied Materials, Inc. and described in U.S. Pat. No. 5,812,483, which is hereby incorporated by reference herein in its entirety.

In accordance with conventional practice a plasma may be struck in the cleaning gas to produce more reactive species and enhance the cleaning process. This may in general be done in two ways: either via circuitry provided in the chamber itself or through a remote plasma source. Alternatively, both techniques may be employed in the same application. Diluent gases including noble gases such as helium, argon, xenon or krypton, or nitrogen or oxygen could be used for various reasons such as improved plasma ignition or plasma stability.

Operating parameters for a cleaning process that employs a fluoride of iodine will vary depending on the specific application. Such factors as the specific iodine fluoride selected, chamber size, nature of the fabrication process carried on in the chamber, and whether in situ plasma generation is employed may all affect appropriate cleaning process parameters. The cleaning process parameters may include: precursor gas flow rate, plasma generator power level, remote plasma chamber pressure, processing chamber pressure and duration of cleaning cycle. For a given cleaning application, suitable cleaning process parameters can readily be determined without undue experimentation. If in situ plasma generation is employed, the required precursor gas flow rate may be less than that required if remote plasma generation is employed, because no reactive species are lost in the transfer process.

As noted before, using an iodine-based precursor such as $IF_5$ or $IF_7$ in a chamber cleaning application provides a more favorable trade-off between advantages and disadvantages than is the case with conventional cleaning gas precursors.

Example of Processing Chamber in which the Invention May Be Applied

FIG. 1 is a side elevational view of a processing system in which the present invention may be applied.

With reference to FIG. 1, the processing system 10 includes a deposition chamber 11 which functions as a processing chamber and has a gas distribution plate 12 having apertures 12a–u and a backing plate 13 adapted to deliver process gases and cleaning gases into the deposition chamber 11, and a susceptor 14 for supporting a substrate 16 to be processed within the deposition chamber 11. The susceptor 14 includes a heater element 18 (e.g., a resistive heater) for elevating the temperature of the substrate 16 to a processing temperature and for maintaining the substrate 16 at the processing temperature during processing. A plurality of lift pins 26 (fixedly held by a lift pin holder 28) penetrate the susceptor 14 (via a plurality of lift pin apertures 30) so as to contact and lift the substrate 16 from the susceptor 14 when the susceptor 14 is lowered by a lift mechanism which is not shown. The deposition chamber 11 further includes a chamber wall liner 29 to facilitate ex-situ cleaning, and a shadow frame 31 which prevents material from depositing or accumulating on the edge of the substrate 16.

In addition to their above described functions, the gas distribution plate 12 and the susceptor 14 also serve as parallel plate upper and lower electrodes, respectively, for generating a plasma within the deposition chamber 11. For example, the susceptor 14 may be grounded and the gas distribution plate 12 coupled to an RF generator 32 via a matching network 34. An RF plasma thereby may be generated between the gas distribution plate 12 and the susceptor 14 through application of RF power supplied thereto by the RF generator 32 via the matching network 34. A vacuum pump 36 is coupled to the deposition chamber 11 for evacuating/pumping the same before, during or after processing as required.

The processing system 10 further includes a process gas supply system 38 coupled to an inlet 40 of the deposition chamber 11 for supplying process gases thereto through the backing plate 13 and the gas distribution plate 12. The process gas supply system 38 includes a valve controller system 42 (e.g., computer controlled mass flow controllers, valves, etc.) coupled to the inlet 40 of the deposition chamber 11, and a plurality of process gas sources 44a, 44b coupled to the valve controller system 42. The valve controller system 42 regulates the flow of process gases to the deposition chamber 11. The specific process gases employed depend on the materials being deposited within the deposition chamber 11.

In addition to the process gas supply 38, the processing system 10 comprises a cleaning gas supply system 46 coupled to the inlet 40 of the deposition chamber 11 (via a gas conductance line 48) to remove accumulated material from the various interior surfaces of the chamber 11. The cleaning gas supply system 46 includes a remote plasma chamber 50 coupled to the gas conductance line 48 and a precursor gas source 54 coupled to the remote plasma chamber 50 via a valve controller system 58. The cleaning gas supply system 46 may also include a supply and a valve controller, which are not shown, for a diluent gas such as argon, helium, hydrogen, nitrogen, oxygen, etc.

A high power microwave generator 60 supplies microwave power to the remote plasma chamber 50 to activate the precursor gas within the remote plasma chamber. A flow restrictor 62 preferably is placed along the gas conductance line 48 to allow a pressure differential to be maintained between the remote plasma chamber 50 and the deposition chamber 11.

In accordance with the invention, the precursor cleaning gas stored in and supplied from the gas source 54 is a gas that includes iodine. Preferably the cleaning gas supplied from the supply 54 is a fluoride of iodine such as $IF_5$ or $IF_7$. It is noted that $IF_5$ is a liquid at room temperature. Consequently, if $IF_5$ is to be the cleaning gas, gas source 54 should include suitable equipment to generate a vapor from liquid $IF_5$. Such equipment might include a heated reservoir arranged to heat the liquid $IF_5$ sufficiently to have a substantial vapor pressure, say about 1 atmosphere. It may also be desirable, if $IF_5$ is the cleaning gas, to heat gas conductance lines.

During cleaning of the deposition chamber 11, the precursor gas is delivered to the remote plasma chamber 50 from the precursor gas source 52. The flow rate of the precursor gas is set by the valve controller system 56. The high power microwave generator 60 applies microwave power to the remote plasma chamber 50 and activates the precursor gas to form one or more reactive species (fluorine atoms or molecules) which travel to the deposition chamber 11 through the gas conductance line 48. The reactive species then travel through the inlet 40, through the backing plate 13, through the gas distribution plate 12 and into the deposition chamber 11.

The foregoing description discloses only the preferred embodiments of the invention and modifications of the above disclosed apparatus and method which fall within the scope of the invention will be readily apparent to those of ordinary skill in the art.

Accordingly, while the present invention has been disclosed in connection with the preferred embodiments thereof, it should be understood that other embodiments may fall within the spirit and scope of the invention, as defined by the following claims.

The invention claimed is:

1. A method of cleaning a processing chamber, the method comprising:

provide a processing chamber adapted to perform a process by which a dielectric material accumulates on chamber components;

generating via a plasma, a fluorine-containing reactive species from a precursor gas that includes a fluoride of iodine; and exposing the chamber components to the reactive species to clean the dielectric material from the chamber components.

2. The method of claim 1, wherein the reactive species are fluorine atoms or fluorine molecules.

3. The method of claim 2, wherein the precursor gas is selected from the group consisting of $IF_5$ and $IF_7$.

4. The method of claim 1, wherein the reactive species are generated in a chamber remote from the processing chamber.

5. The method of claim 1, wherein the plasma is struck in the processing chamber.

6. The method of claim 1 wherein the dielectric material comprises a dielectric selected from the group consisting of silicon dioxide, silicon nitride and $SiO_xN_yH_z$.

7. A method of cleaning a processing chamber, the method comprising:
   providing a processing chamber adapted to perform a process by which a metal accumulates on chamber components;
   generating via a plasma, a fluorine-containing reactive species from a precursor gas that includes a fluoride of iodine; and
   exposing the chamber components to the reactive species to clean the metal from the chamber components.

8. The method of claim 7 wherein the metal comprises a metal selected from the group consisting of tungsten, titanium and tantalum.

9. A method of cleaning a processing chamber, the method comprising:
   providing a processing chamber adapted to perform a process by which at least one of tantalum nitride and titanium nitride accumulates on chamber components;
   generating via a plasma, a fluorine-containing reactive species from a precursor gas that includes a fluoride of iodine; and
   exposing the chamber components to the reactive species to clean the at least one of tantalum nitride and titanium nitride from the chamber components.

* * * * *